United States Patent [19]

Francis

[11] Patent Number: 5,357,220

[45] Date of Patent: Oct. 18, 1994

[54] EMITTER-COUPLED OSCILLATOR WITH DIFFERENTIAL SWITCHING CONTROL

[75] Inventor: John R. Francis, Burlington, Canada

[73] Assignee: Gennum Corporation, Burlington, Canada

[21] Appl. No.: 6,402

[22] Filed: Jan. 21, 1993

[51] Int. Cl.⁵ .......................... H03B 5/04; H03B 5/24; H03L 1/02; H03L 7/099

[52] U.S. Cl. .................................. 331/113 R; 331/34; 331/144; 331/176; 331/177 R

[58] Field of Search ...................... 331/34, 111, 113 R, 331/143, 144, 176, 177 R

[56] References Cited

U.S. PATENT DOCUMENTS 4,977,381 12/1990 Main ................................. 331/111
5,034,706 7/1991 Betti et al. ................... 331/177 R X

OTHER PUBLICATIONS

A250–MHz Monolithic Voltage–Controlled . . . , Ting-Ping Liu et al., IEEE,JSSC, Apr. 1990, pp. 555–561.
A Low–Power 128 MHz VCO . . . , Kazuo Kato et al., IEEE,JSSC, Apr. 1988, pp. 474–479.
Bipolar & Mos Analog Integrated Circuit . . . , Allan Grebene, Wiley, 1984, pp. 571–575.
A Highly Stable VCO . . . , Robert Cordell et al., IEEE,JSSC, Dec. 1975, pp. 480–485.

Primary Examiner—David Mis
Attorney, Agent, or Firm—Bereskin & Parr

[57] ABSTRACT

An emitter-coupled oscillator circuit suitable for monolithic integration. The emitter-coupled oscillator circuit comprises (a) switching means for producing at an output port an output signal having a variable oscillation frequency, and the switching means has first and second inputs for receiving a differential control signal and the switching means includes first and second terminals for connecting to a capacitor; (b) output port means coupled to the output port of the switching means for outputting the output signal; (c) frequency control means coupled to the first and second terminals of the switching means for adjusting the oscillation frequency of the output signal; and (d) switching control means for producing a differential control signal at first and second outputs coupled to the first and second inputs respectively of the switching means and the switching means being responsive to the differential control signal for producing the output signal, and the switching control means having a control terminal coupled to the frequency control means.

10 Claims, 4 Drawing Sheets

EMITTER-COUPLED OSCILLATOR WITH DIFFERENTIAL SWITCHING CONTROL

FIELD OF THE INVENTION

This invention relates to a current-controlled oscillator topology. More particularly this invention provides a current-controlled oscillator (CCO) topology which is suited for application in a monolithic voltage-controlled oscillator (VCO).

BACKGROUND OF THE INVENTION

A current-controlled oscillator is one of the functional blocks comprising a voltage controlled oscillator. In the prior art, current-controlled oscillators can be based on emitter-coupled multivibrators. The emitter-coupled multivibrator oscillates at a frequency which is proportional to $I/V_{BE}$, where $V_{BE}$ is the drop across a clamping diode. In known manner, the frequency of the multivibrator is varied by adjusting I, and is temperature compensated by making current I a function of $V_{BE}/R_x$, where $R_x$ is a low temperature coefficient external resister. In the known emitter-coupled multivibrators, the maximum operation frequency is limited by switching losses and by the collector-substrate capacitance of the coupled transistors combined with the peak-to-peak voltage swing across the base-emitter junctions. Moreover, at high operating frequencies these effects worsen the temperature stability of the emitter-coupled multivibrator. Lastly, the minimum supply voltage for an emitter-coupled multivibrator is determined by the minimum voltage across the current sources which is given by $V_{CC} - 3 V_{BE}$.

The present invention addresses these limitations of known emitter-coupled multivibrators by providing a topology for a current-controlled oscillator which has a higher maximum operating frequency, a lower temperature coefficient, and a lower operating supply voltage.

BRIEF SUMMARY OF THE INVENTION

The present invention provides an emitter-coupled oscillator circuit suitable for monolithic integration, said emitter-coupled oscillator circuit comprising: (a) switching means for producing at an output port an output signal having a variable oscillation frequency, and said switching means having first and second inputs for receiving a differential control signal and said switching means including first and second terminals for connecting to a capacitor; (b) output port means coupled to the output port of said switching means for outputting said output signal; (c) frequency control means coupled to the first and second terminals of said switching means for adjusting the oscillation frequency of said output signal; and (d) switching control means for producing a differential control signal at first and second outputs coupled to the first and second inputs respectively of said switching means and said switching means being responsive to said differential control signal for producing said output signal, and said switching control means having a control terminal coupled to said frequency control means.

BRIEF DESCRIPTION OF THE DRAWINGS

For a better understanding of the present invention, and to show more clearly how it may be carried into effect, reference will now be made by way of example, to the accompanying drawings which show preferred embodiments of the present invention.

DETAILED DESCRIPTION OF THE PREFERRED EMBODIMENTS

Figure 1:
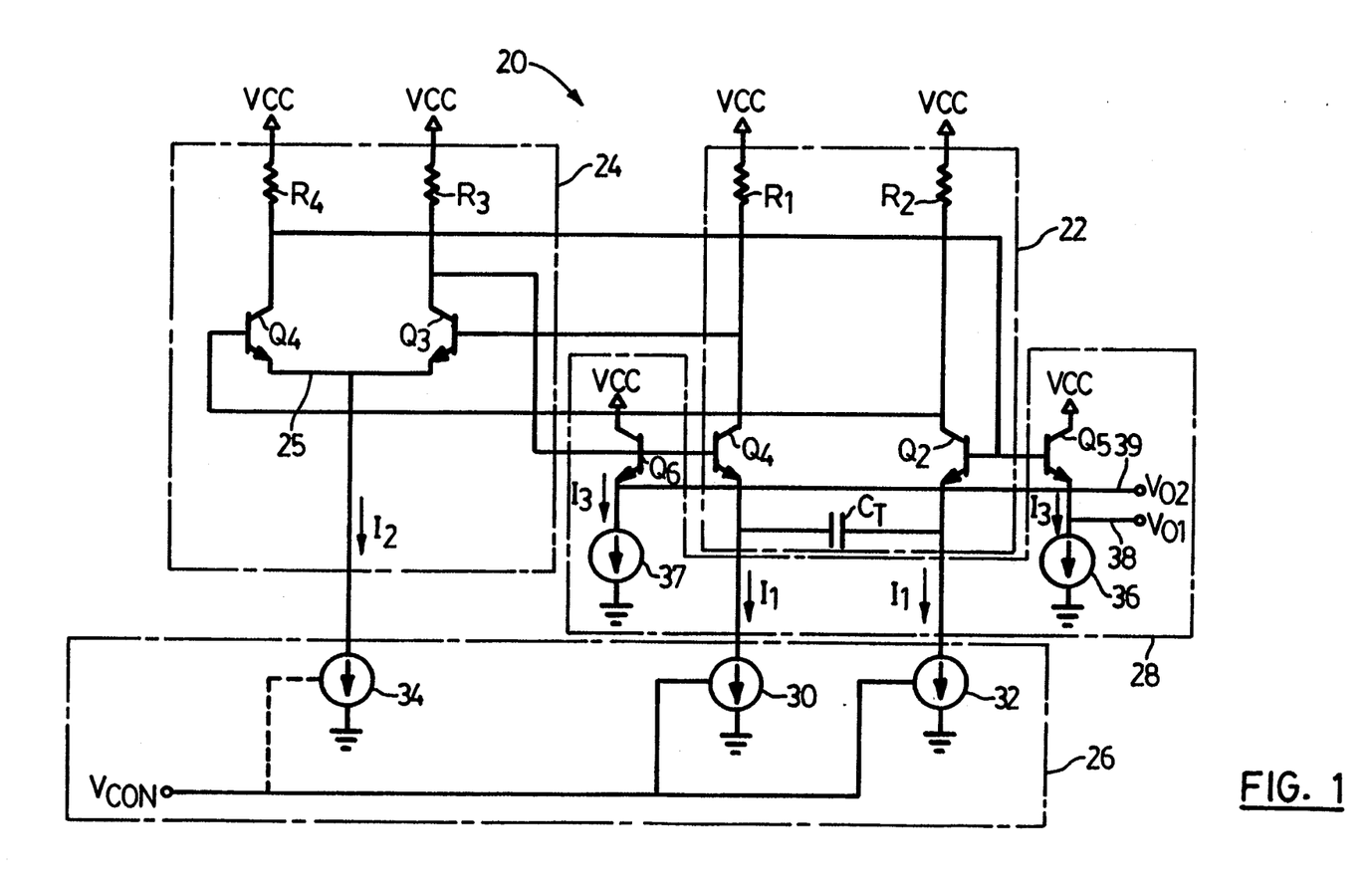
FIG. 1 shows a current-controlled oscillator according to the present invention.

Reference is first made to FIG. 1, which shows an emitter-coupled multivibrator 20 (also known as current controlled oscillator abbreviated CCO) according to the present invention. The emitter-coupled multivibrator 20 comprises an emitter-coupled switching stage 22, a switching control stage 24, a current control network 26, and an output stage 28.

The emitter-coupled switching stage 22 comprises a pair of transistors $Q_1$ and $Q_2$ which are matched. The emitters of the transistors $Q_1$, $Q_2$ are coupled through a timing capacitor $C_T$. The emitter of transistor $Q_1$ is also connected to a first current source 30 and the emitter of transistor $Q_2$ is connected to a second current source 32. The current sources 30, 32 are also matched, with each sinking a current $I_1$ which biases the respective transistor $Q_1$ or $Q_2$. The two current sources 30, 32 and a third current source 34 comprise the current control network 26. The collectors of the transistors $Q_1$, $Q_2$ are coupled to a positive supply voltage rail $V_{CC}$ through respective resistors $R_1$ and $R_2$ which are matched resistors. The transistors $Q_1$ and $Q_2$ are cross-coupled through the switching control stage 24 as will be explained below.

Referring still to FIG. 1, the switching control stage 24 comprises a pair of transistors $Q_3$ and $Q_4$. The emitters of transistors $Q_3$ and $Q_4$ are directly coupled to form a differential amplifier 25. The emitters of transistors $Q_3$ and $Q_4$ are also connected to the third current source 34. The third current source 34 sinks a current $I_2$ which is the sum of the emitter currents flowing in transistors $Q_3$ and $Q_4$. The collectors of transistors $Q_3$ and $Q_4$ are connected to the positive supply rail $V_{CC}$ through respective load resistors $R_3$ and $R_4$ which are matched resistors.

As introduced above, transistors $Q_1$ and $Q_2$ in the emitter-coupled switching stage 22 are cross-coupled. Cross-coupling assures that either transistor $Q_1$ or transistor $Q_2$ (but not both) is on at any one time. Transistors $Q_1$ and $Q_2$ are cross-coupled through transistors $Q_3$ and $Q_4$ which form the differential amplifier 25 in the switching control stage 24. The base of transistor $Q_1$ is connected to the collector of transistor $Q_3$ and the collector of transistor $Q_1$ is connected to the base of transistor $Q_3$. Similarly, the base of transistor $Q_2$ is connected to the collector of transistor $Q_4$ and the collector of transistor $Q_2$ is connected to the base of transistor $Q_4$.

The output stage 28 of the emitter-coupled multivibrator 20 comprises a pair of transistors $Q_5$ and $Q_6$. The base of transistor $Q_5$ is connected to the base of transistor $Q_2$ and the collector of transistor $Q_4$. The emitter of transistor $Q_5$ is connected to a fourth current source 36, which sinks a current $I_3$.

As shown in FIG. 1, the emitter of transistor $Q_5$ provides a voltage output signal $V_{O1}$ on output line 38. Transistor $Q_5$ functions as a unity gain buffer. As a unity gain buffer, the emitter of transistor $Q_5$ follows the signal (i.e. collector output of transistor $Q_4$) which is applied to the base of transistor $Q_5$. The voltage gain of transistor $Q_5$ is unity, but the current gain is high thereby providing good drive capability for the output stage 28.

Similarly, the base of the other transistor $Q_6$ is connected to the collector of transistor $Q_3$ and the emitter of transistor $Q_6$ is connected to a fifth current source 37. The current source 37 also sinks a current $I_3$. Transistor $Q_6$ is also configured as an emitter follower or unity gain buffer. Transistor $Q_6$ produces a voltage signal $V_{O2}$ on output line 39 which is connected to the emitter of transistor $Q_6$. In this way, the two output lines 38, 39 provide a buffered output signal $V_O$, i.e. $V_{O1}-V_{O2}$, as will be discussed in more detail below.

The operation of the emitter-coupled multivibrator 20 can be briefly explained as follows. The cross-coupling of transistors $Q_1$ and $Q_2$ through the differential amplifier 25 assures that either transistor $Q_1$ or transistor $Q_2$ (but not both) is on at any one time. In this manner, the timing capacitor $C_T$ is alternately charged with equal but opposite currents, first through transistor $Q_1$ and then through transistor $Q_2$, during alternate half-cycles of operation of the switching stage 22.

When transistor $Q_2$ switches on, transistor $Q_1$ turns off, and the voltage stored across the timing capacitor $C_T$ is given by the expression $R_3 \times I_2$. When transistor $Q_2$ switches on, the base of transistor $Q_4$ is pulled down; and when transistor $Q_1$ turns off, the base of transistor $Q_3$ is pulled up to the positive supply rail $V_{CC}$. This causes transistor $Q_3$ to turn on and transistor $Q_4$ to turn off and the collector current of transistor $Q_3$ will be current $I_2$. When transistor $Q_4$ turns off, the base of transistor $Q_2$ is pulled up to the positive supply rail $V_{CC}$ by resistor $R_4$. When transistor $Q_3$ turns on, the base of transistor $Q_1$ is pulled down by $R_3 \times I_2$. Now the timing capacitor $C_T$ will have to be discharged by $2 \times R_3 \times I_2$ before transistor $Q_1$ will conduct current. Since transistor $Q_1$ is cut-off, all of the current $I_1$ from the current source 30 flows through the capacitor $C_T$ discharging the voltage level at the emitter of transistor $Q_1$. The current $I_1$ flowing through the capacitor $C_T$, plus the current $I_1$ from the current source 32, flow through the emitter of transistor $Q_2$ such that (neglecting base current) $2 \times I_1$ flows in the collector of transistor $Q_2$. When the voltage level at the emitter of transistor $Q_1$ drops by $2 \times R_3 \times I_2$ then the base-emitter junction of transistor $Q_1$ will be forward biased and transistor $Q_1$ will turn on. When transistor $Q_1$ turns on, resistor $R_3$ pulls the base of transistor $Q_1$ to the positive supply rail $V_{CC}$. At the same time, transistor $Q_4$ switches on and pulls down the base of transistor $Q_2$ by a voltage value which is equal to $R_4 \times I_2$ volts. This causes transistor $Q_2$ to turn off (i.e. cut-off), and the timing capacitor $C_T$ must be discharged by a voltage $2 \times R_4 \times I_2$ before transistor $Q_2$ will conduct current i.e. turn on.

Figure 2:
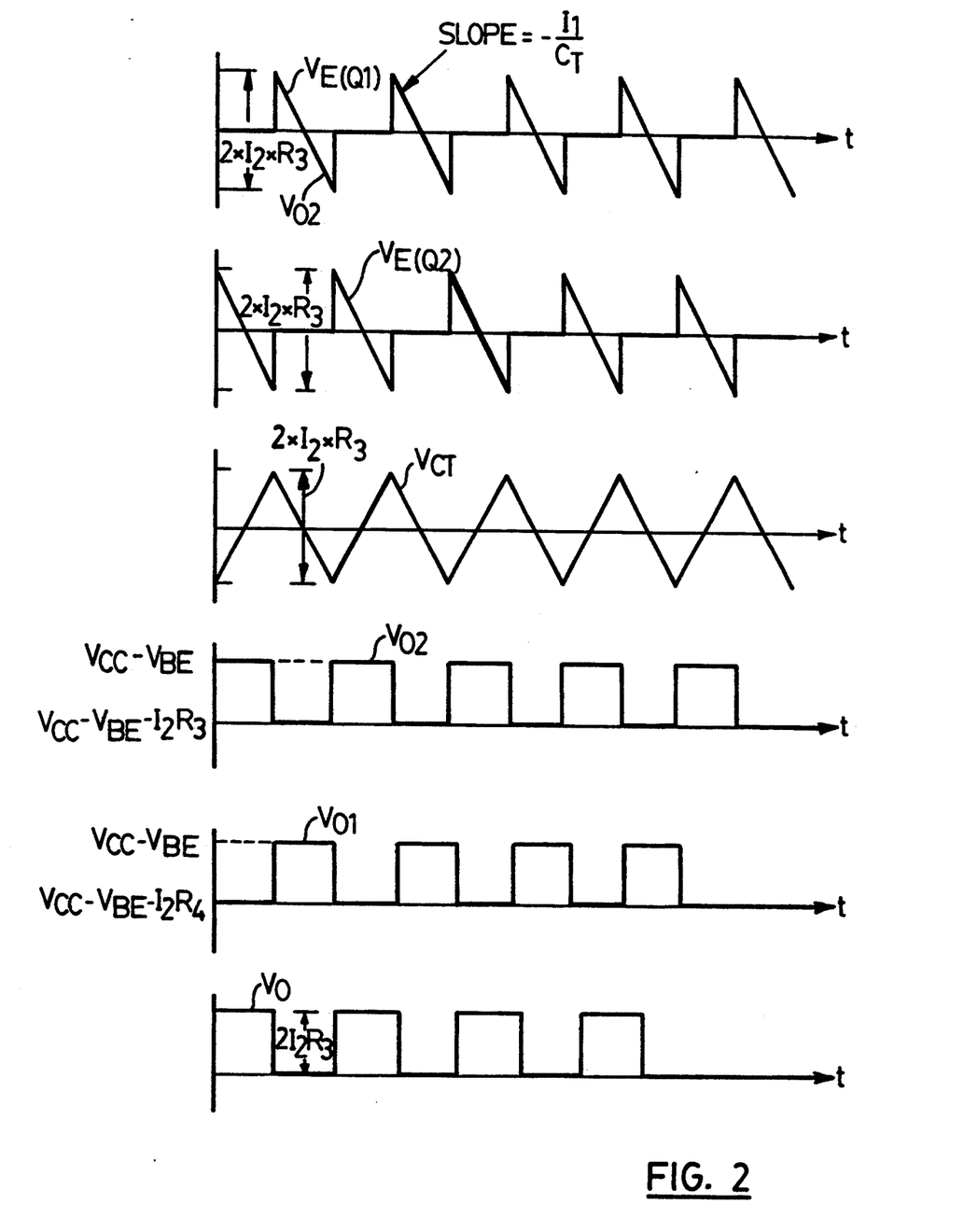
FIG. 2 is a timing diagram showing selected voltage signals produced by the current-controlled oscillator of FIG. 1.

The timing capacitor $C_T$ produces a voltage signal $V_{CT}$ (i.e. $V_E(Q_1)-V_E(Q_2)$) which is a triangular waveform. As shown in FIG. 2, the voltage output signal $V_O$ (which is derived from the voltage signal $V_{CT}$) comprises the two half-cycle voltage signal waveforms $V_{O1}$ and $V_{O2}$ which are produced at the emitters of transistors $Q_5$ and $Q_6$ respectively. The total peak-to-peak voltage swing of the waveforms $V_{O1}$ and $V_{O2}$ is $2 \times I_2 \times R_3$ volts. This follows because the cut-off transistor (i.e. $Q_1$ or $Q_2$) in the switching stage 22 will turn on when there is a voltage drop of $2 \times I_2 \times R_3$ at the respective emitter. Lastly, the voltage signal $V_O$ has an oscillation frequency $f_O$. The oscillation frequency $f_O$ is governed by the resistors $R_3$ and $R_4$ and the timing capacitor $C_T$ and the current sources 30, 32, 34. The current sources 30, 32, in turn, are controlled by a voltage control input $V_{CON}$ as will be discussed in detail below. Alternatively, the current source 34 can be controlled by $V_{CON}$ and current sources 30, 32 would not be controlled but left constant.

In the preferred embodiment of the present invention, transistors $Q_1$ and $Q_2$, in the switching stage 22, and transistors $Q_3$ and $Q_4$, in the switching control stage 24, are operated in the active region, i.e. non-saturation region. This can be achieved by having the voltage swing across the load resistors $R_3$ and $R_4$ in the switching control stage $24 \leq 400$ mV, and the voltage across the resistors $R_1$ and $R_2$ in the switching stage $22 \leq 400$ mV.

The rate of discharge of the timing capacitor $C_T$ determines the rate at which the transistors $Q_1$ and $Q_2$ switch states, i.e. cut-off to on and vice versa. Since the rate of discharge of the capacitor $C_T$ is equal to $I_1/C_T$, adjusting the magnitude of the current $I_1$ sunk by the first and second current sources 30, 32 will control the oscillation frequency $f_O$ of the emitter-coupled multivibrator 20.

Figure 3:
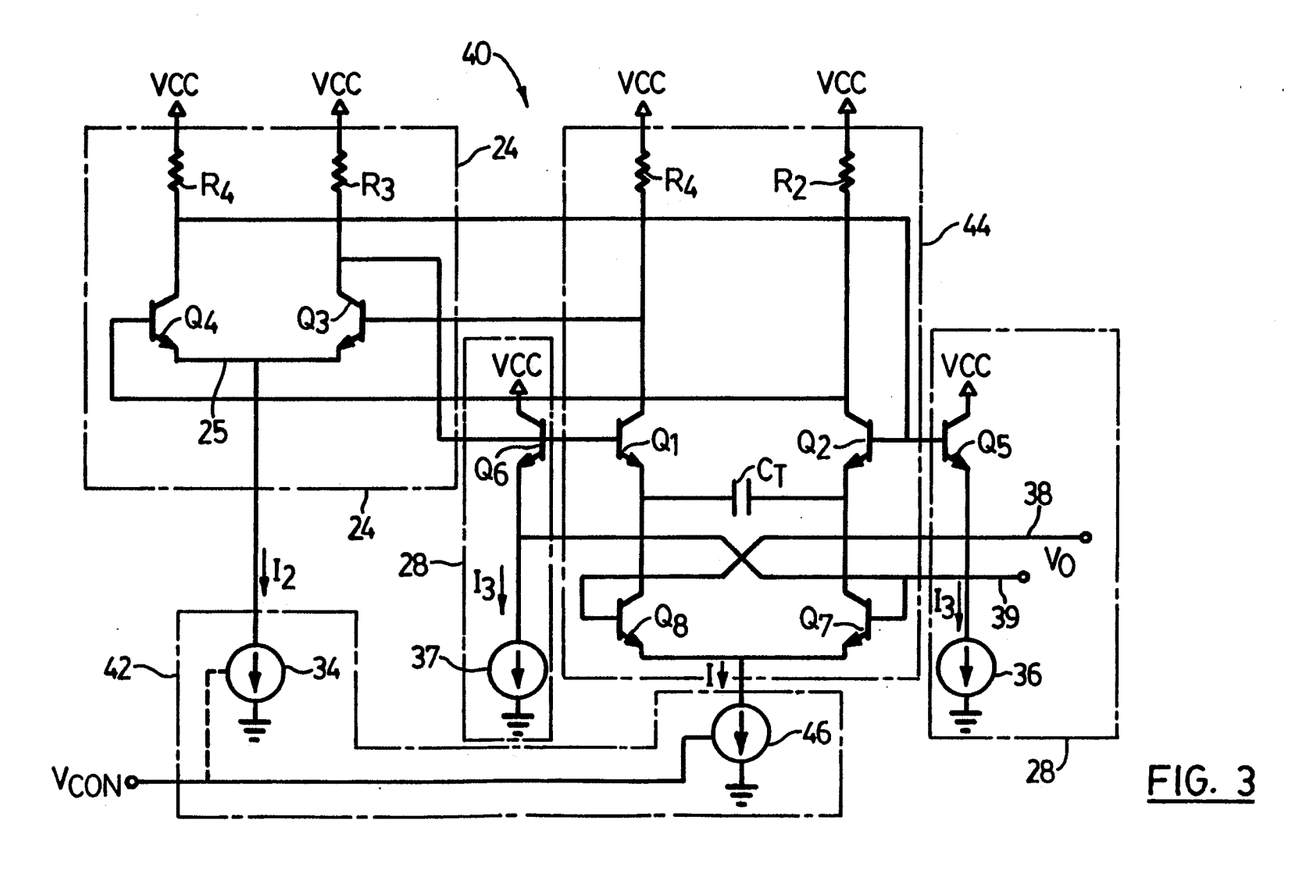
FIG. 3 shows a second embodiment of the current-controlled oscillator according to the present invention.

Reference is next made to FIG. 3, which shows an emitter-coupled multivibrator 40 according to a second embodiment of the present invention. The emitter-coupled multivibrator 40 has the same structure, i.e. the emitter-coupled switching stage 22, the switching control stage 24, and the output stage 28, as the emitter-coupled multivibrator 20 shown in FIG. 1 and corresponding reference numerals indicate elements corresponding to those of FIG. 1. However, the current control stage indicated by reference 42 is modified as shown in FIG. 3. The emitter-coupled switching stage as indicated by reference 44 has also been modified to include two additional transistors $Q_7$ and $Q_8$. The function of the two transistors $Q_7$ and $Q_8$ is to reduce switching losses in the switching stage 44 thereby increasing the maximum oscillation frequency $f_O$. The collector of transistor $Q_7$ is connected to the emitter of transistor $Q_2$ and the base of transistor $Q_7$ is connected to the emitter of transistor $Q_6$. Similarly, the collector of transistor $Q_8$ is connected to the emitter of transistor $Q_1$ and the base of transistor $Q_8$ is connected to the emitter of transistor $Q_5$. The emitters of transistors $Q_7$ and $Q_8$ are connected together and coupled to a current source 46. The current source 46 replaces the two current sources 30, 32 (FIG. 1) and sinks a current I which is twice the magnitude of current $I_1$.

In the first embodiment of the emitter-coupled multivibrator 20 shown in FIG. 1, the only coupling between the rising edge of the voltage signal $V_E(Q_1)$ at the emitter of transistor $Q_1$ and the emitter of transistor $Q_2$ was through the timing capacitor $C_T$. In the second embodiment shown in FIG. 3, the base of transistor $Q_8$ is rising at the same time as the emitter of transistor $Q_2$ (through the emitter-follower action of transistor $Q_5$), and the base-collector capacitance of transistor $Q_8$ couples the rising edge of the base transistor $Q_8$ to the emitter of transistor $Q_1$. Since transistors $Q_2$, $Q_6$ and $Q_7$ are a mirror image of transistors $Q_2$, $Q_5$ and $Q_8$, they also function as described above.

Figure 4:
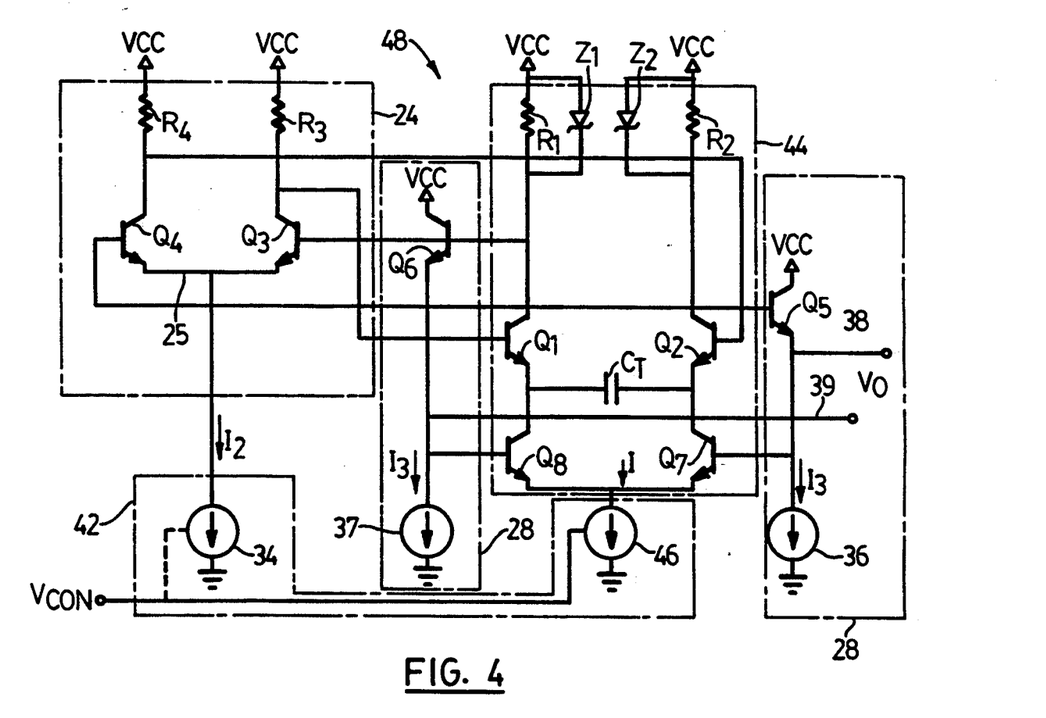
FIG. 4 shows another aspect of the second embodiment of the current-controlled oscillator in FIG. 3.

Reference is next made to FIG. 4, which shows another aspect of the emitter-coupled multivibrator according to the second embodiment of the present invention. The emitter-coupled multivibrator shown in FIG. 4 is denoted by reference 48. The multivibrator 48 shown in FIG. 4 is identical to the multivibrator 40 shown in FIG. 3 except the configuration of the output transistors $Q_5$ and $Q_6$ have been changed and corresponding reference numerals indicate elements corresponding to those of FIGS. 1 and 3. The base (i.e. input) of transistor $Q_5$ is now connected to the base of transistor $Q_4$ instead of the collector (i.e. output) of transistor $Q_4$. Similarly, the base of the other output transistor $Q_6$ is connected to the base of transistor $Q_3$. It was explained above that transistors $Q_3$ and $Q_4$ are turned on when their respective bases are pulled up to the positive supply rail $V_{CC}$. For the circuit topology shown in FIG. 4, the respective output transistor $Q_5$ or $Q_6$ will also be pulled up when the base of the corresponding transistor $Q_4$ or $Q_3$ is pulled up to the supply rail $V_{CC}$. This means that transistor $Q_7$ or $Q_8$ will be turned on earlier than in the circuit topology for multivibrator 40 shown in FIG. 3. In practical terms, the emitter-coupled multivibrator 48 shown in FIG. 4 will have a higher maximum oscillation frequency $f_O$ because the switching of transistors $Q_7$ and $Q_8$ occurs earlier.

There may be applications where a larger range of oscillation frequency $f_O$ is required. As discussed above, the range of the oscillation frequency $f_O$ can be controlled by varying the magnitude of the current $I_1$ (or I). However, increasing the current $I_1$ can put transistors $Q_1$ and $Q_2$ in saturation, i.e. if $2 \times I_1 \times R_1$ (or $R_2$) $\geq 0.4$ volts. To keep transistors $Q_1$ and $Q_2$ from saturating, the emitter-coupled multivibrator 40 or 48 can include a pair of Schottky diodes $Z_1$ and $Z_2$ (shown in broken outline in FIG. 4). The Schottky diode $Z_1$ is connected across resistor $R_1$ and the Schottky diode $Z_2$ is connected across $R_2$ to form a simple Schottky clamp. To keep transistors $Q_1$ and $Q_2$ out of saturation, the forward voltage of the Schottky diodes $Z_1$ or $Z_2$ should be in the range 300 to 500 mV.

It will be appreciated by those skilled in the art that the circuit topology for the emitter-coupled multivibrator 40 shown in FIG. 3 is used when dynamic range is important. The current I can be adjusted to vary the oscillation frequency $f_O$ without varying the voltage swing of the output voltage signal $V_O$ at the emitters of transistors $Q_5$ and $Q_6$. For a larger dynamic range, the Schottky diodes $Z_1$ and $Z_2$ can be used to prevent transistors $Q_1$ and $Q_2$ from entering saturation as discussed above.

On the other hand, the circuit topology for the emitter-coupled multivibrator 48 shown in FIG. 4 is used when a very high oscillation frequency $f_O$ is required. The current $I_2$ is adjusted to vary the oscillation frequency $f_O$ without varying the peak-to-peak voltage swing of the voltage output signal $V_O$ at the emitters of transistors $Q_5$ and $Q_6$.

Figure 5:
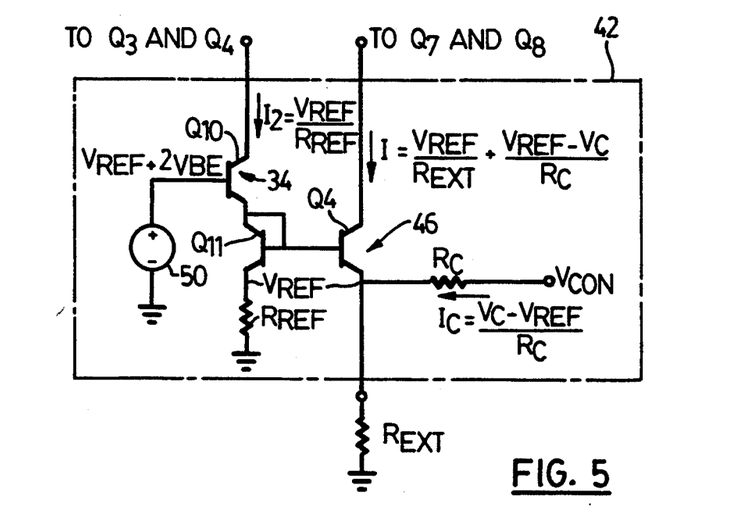
FIG. 5 shows a frequency control network suitable for the current-controlled oscillators shown in FIGS. 3 and 4.

Lastly, reference is made to FIG. 5 which shows a circuit topology for a current control network 42 which is suitable for both embodiments of the emitter-coupled multivibrator 40, 48 according to the present invention. The current control network 42 shown in FIG. 5 provides a circuit topology which has a low temperature coefficient, i.e. which is independent of temperature variations on the PN junctions of the transistors $Q_1$ to $Q_8$.

As shown in FIG. 5, the current control network 42 comprises current source 34, current source 46, a voltage source 50, a reference resistor $R_{REF}$ and an external resistor $R_{EXT}$. The current source 46 comprises a transistor $Q_9$. The collector of transistor $Q_9$ is connected to the emitters of transistors $Q_7$ and $Q_8$ shown in FIGS. 3 and 4. The emitter of transistor $Q_9$ is connected to the external resistor $R_{EXT}$ and a resistor $R_C$. Resistor $R_C$ is connected to the input which receives the control voltage $V_{CON}$. The other current source 34 in the frequency control network 42 also comprises a transistor $Q_{10}$. The collector of transistor $Q_{10}$ is connected to the emitters of transistors $Q_3$ and $Q_4$, i.e. the differential amplifier 25, shown in both FIGS. 3 and 4. The base of transistor $Q_{10}$ is connected to the voltage reference source 50 which produces an output voltage level of $V_{REF} + 2V_{BE}$ volts, where $V_{BE}$ is the forward voltage drop across the base-emitter junction of the transistors. The emitter of transistor $Q_{10}$ is coupled to a diode-connected transistor $Q_{11}$. The emitter of diode-connected transistor $Q_{11}$ is connected to the reference resistor $R_{REF}$.

Referring still to FIG. 5, the voltage level at the emitter of diode-connected transistor $Q_{11}$ is $V_{REF}$ volts and the voltage level at the emitter of transistor $Q_9$ is also $V_{REF}$ volts. Thus, the current I which is sunk by transistor $Q_9$ is given by the following expression:

$$I = \frac{V_{REF}}{R_{EXT}} + \frac{V_{REF} - V_{CON}}{R_C} \qquad (1)$$

and the current $I_2$ which transistor $Q_{10}$ sinks is determined according to the following expression:

$$I_2 = \frac{V_{REF}}{R_{REF}} \qquad (2)$$

As can be seen from the two above expressions (1) and (2), the currents I and $I_2$ are independent of both the supply voltage $V_{CC}$ and the base-emitter voltage drop $V_{BE}$ which is very susceptible to temperature variation. Furthermore, the voltage reference source 50 can have any temperature coefficient without affecting the oscillation frequency $f_O$ as can be seen from expression (6) below. However for best performance, the voltage reference source 50 should have a zero temperature coefficient so that for any control voltage $V_{CON}$, the temperature coefficient for the current I remains unchanged. One skilled in the art can modify current control network 42 for operation with the emitter-coupled multivibrator shown in FIG. 1.

For the emitter-coupled multivibrator 20 shown in FIG. 1, the oscillation frequency $f_O$ of the output voltage signal $V_O$ is varied by adjusting current sources 30, 32 (i.e. current $I_1$) or current source 34 (i.e. current $I_2$). For the emitter-coupled multivibrator 40 and 42 (FIG. 3 and FIG. 4 respectively), the oscillation frequency $f_O$ is adjusted by setting the current source 34 (i.e. current $I_2$) or the current source 46 (i.e. current I). It will be appreciated by those skilled in the art that adjusting current source 34 (i.e. current $I_2$) will vary the voltage swing at the output stage 28.

In known emitter-coupled multivibrators (not shown), the frequency of oscillation is inversely proportional to the voltage drop $V_{BE}$ which varies at a rate of $\approx -2$ mV/°C.$_T$. This temperature variance results in a positive temperature coefficient for the oscillation frequency $f_O$.

As discussed above, a feature of the present invention is that the emitter-coupled multivibrators 20, 40, 48 are temperature compensated by making the oscillation frequency $f_O$ a function of the voltage reference source 50, the reference resistor $R_{REF}$, and the external resistor $R_{EXT}$.

For the emitter-coupled multivibrator 20, the oscillation frequency $f_O$ can be determined as follows. Each half-cycle of oscillation, i.e. for voltage signals $V_E(Q_2)$ and $V_E(Q_1)$, is given by the following expression:

$$dt = \frac{C_T}{I_1} \times dv \quad (3)$$

where the peak-to-peak voltage swing, i.e. dv, across the timing capacitor $C_T$ is $2 \times I_2 \times R_3$ as was discussed above. By replacing dv in the above expression with $2 \times I_2 \times R_3$, the period of the half-cycle voltage signal $V_{O1}$ or $V_{O2}$ is:

$$dt = 2 \times \frac{C_T}{I_1} \times I_2 \times R_3 \quad (4)$$

To determine the period of oscillation, i.e. $f_O$, of the voltage output signal $V_O$, the above expression (4) is merely multiplied by two. The oscillation frequency $f_O$ is simply the inverse of the period of oscillation T and can be expressed as follows:

$$f_o = \frac{I_1}{4 I_2 C_T R_3} \quad (5)$$

by making the currents $I_1$ and $I_2$ functions of the voltage reference source 50, the on-chip reference resistor $R_{REF}$, and the external resistor $R_{EXT}$, the dependence on a bi-polar junction voltage (i.e. $V_{BE}$) which is susceptible to temperature variance is eliminated.

The temperature compensation can be demonstrated as follows. If $I_1 = V_{REF}/R_{EXT}$ and $I_2 = V_{REF}/R_{REF}$ are substituted into the above expression (5), the oscillation frequency $f_O$ is:

$$f_o = \frac{1}{4} \times \times \frac{1}{C_T R_{EXT}} \times \frac{R_{REF}}{R_3} \quad (6)$$

It can be seen that the voltage reference 50 can have any temperature coefficient since it will not affect the frequency of oscillation $f_O$. The reference resistor $R_{REF}$ can be matched to resistor $R_3$ since they are both on-chip resistors, and the external resistor $R_{EXT}$ is selected to have a very low temperature coefficient thereby also not affecting the stability of the oscillation frequency $f_O$.

The emitter-coupled multivibrators 20, 40, 48 according to the present invention also provide a higher maximum oscillation frequency $f_O$ over the prior art because the peak-to-peak voltage swings of the output voltage signal $V_O$ (i.e. $\leq 400$ mV) are lower, and therefore switching losses are reduced by the circuit topology of the present and by lower values of resistors $R_1$ and $R_2$ (see below) than for the equivalent resistors in the known emitter-coupled multivibrators (not shown).

In addition, the emitter-coupled multivibrators 20, 40, 48 according to the present invention can operate at lower supply voltages, i.e. $V_{CC}$, than required for the prior art devices. The minimum supply voltage for the first embodiment of the emitter-coupled multivibrator 20 shown in FIG. 1 is determined by the minimum voltage across the current sources 30, 32, 34. It is within the capability of one skilled in the art to calculate that the minimum voltage across the current sources 30, 32, 34 is $V_{CC} - 0.4 - V_{BE}$ volts. This is $2V_{BE} - 0.4$ volts less than the supply voltage required for known devices. For the emitter-coupled vibrators 40 and 48 shown in FIGS. 3 and 4 respectively, the minimum voltage across the current source 46 is $V_{CC} - 0.4 - 2V_{BE}$ volts, which presents a $V_{BE} - 0.4$ volt improvement over the prior art devices.

For the components shown in the previous Figures, the component values are as follows:

| Reference | Description | Value |
| --- | --- | --- |
| $R_1, R_2, R_3, R_4$ | Resistor | 200 Ohms |
| $R_{REF}$ | Resistor | 200 Ω |
| $R_{EXT}$ | Resistor | 270 Ω |
| Capacitor | $C_T$ | 0.5 pico-Farads |
| $R_C$ | Resistor | 1 kΩ |
| $V_{REF}$ | Voltage Reference | 0.4 V |

Although various preferred embodiments of the present invention have been described in detail, it will be appreciated by those skilled in the art, that variations may be made without departing from the spirit of the invention of the scope of the following claims.

I claim:

1. An emitter-coupled oscillator circuit suitable for monolithic integration, said emitter-coupled oscillator circuit comprising:
   (a) switching means for producing at an output port an output signal having a variable oscillation frequency, and said switching means having first and second inputs for receiving a differential control signal and said switching means including first and second terminals for connecting to a capacitor;
   (b) output port means coupled to the output port of said switching means for outputting said output signal;
   (c) frequency control means coupled to the first and second terminals of said switching means for adjusting the oscillation frequency of said output signal; and
   (d) switching control means for producing a differential control signal at first and second outputs coupled to the first and second inputs respectively of said switching means and switching means being responsive to said differential control signal for producing said output signal, and said switching control means having a control terminal coupled to said frequency control means.

2. The oscillator circuit claimed in claim 1, wherein said frequency control means comprises first and second current sources, said first current source having means for producing a current at an output coupled to the first and second terminals of said switching means and said second current source having means for producing a current at an output coupled to the control terminal of said switching control means, and said frequency control means including a control input port for electrically connecting an external resistor to said first current source, and said frequency control means includes a voltage control line coupled to one of said first and second current sources and means responsive to a voltage signal applied to said voltage control line for controlling the operation of said respective first and second current sources.

3. The oscillator circuit claimed in claim 2, wherein said frequency control means comprises a voltage source and said first current source comprises a first transistor and said second current source comprises a second transistor, each of said transistors having a base input, an emitter output and a collector output, said voltage source being connected to the base input of said second transistor, and the emitter output of said second transistor being coupled to the base input of said first transistor through a diode-connected transistor, the emitter output of said first transistor being connected to said voltage control line through a resistor, and the collector output of said first transistor forming the output for said first current source and being connected to the first terminal of said switching means and the collector output of said second transistor forming the output for said second current source and being connected to the second terminal of said switching control means.

4. The circuit claimed in claim 2 wherein said switching control means comprises a differential amplifier formed from first and second transistors, each of said transistors having a base input, an emitter output and a collector output, the emitter of said first transistor being connected to the emitter of said second transistor and forming said control terminal coupled to said frequency control means, the bases of said first and second transistors forming a differential input port coupled to the output port of said switching means and said differential amplifier being responsive to the output signal coupled to said base inputs for producing said differential output signal at an output port formed from the collector of said first transistor and the collector from said second transistor.

5. The oscillator circuit claimed in claim 4, wherein said switching means comprises first and second switching transistors, each of said switching transistors having a base input, an emitter output and a collector output, the emitter outputs of said first and second switching transistors being coupled through a capacitor, and the base inputs of said first and second switching transistors being coupled to the first and second collector outputs of said differential amplifier respectively and the collector outputs of said first and second switching transistors being coupled to the base inputs of said differential amplifier respectively, so that said first and second switching transistors are cross-coupled through said differential amplifier.

6. The oscillator circuit claimed in claim 5, wherein said switching means is coupled to said frequency control means through first and second accelerator transistors, each of said accelerator transistors having a base input, an emitter output and a collector output, the emitter outputs of said accelerator transistors being connected together and coupled to said frequency control means, the collector output of said first accelerator transistor being connected to the emitter output of said first switching transistor and the collector output of said second accelerator transistor being connected to the emitter output of said second switching transistor, and the base inputs of said first and second accelerator transistors being coupled to the first and second collector outputs of said differential amplifier respectively.

7. A oscillator suitable for use in a phase-locked loop system having a phase detector and a loop filter, said current-controlled oscillator comprising:

(a) a monolithically integrated circuit comprising:

(i) switching means for producing an output signal having a variable oscillation frequency, and said switching means having first and second inputs for receiving a differential control signal and said switching means including first and second terminals for connecting to a capacitor;

(ii) output port means coupled to the output port of said switching means for outputting said output signal to the phase detector stage of: the phase-locked loop;

(iii) frequency control means coupled to the first and second terminals of said switching means for adjusting the oscillation frequency of said output signal, said frequency control means including a control input port coupled to the loop filter for receiving a voltage control signal, said frequency control means including temperature compensation means; and (iv) switching control means for producing a differential control signal at first and second outputs coupled to the first and second inputs respectively of said switching means and said switching means being responsive to said differential control signal for producing said output signal, and said switching control means having a control terminal coupled to said frequency control means;

(b) an external resistor coupled to said frequency control means, said resistor having a low temperature coefficient.

8. The oscillator claimed in claim 7, wherein said frequency control means comprises first and second current sources, said first current source having means for producing a current at an output coupled to the first and second terminals of said switching means and said second current source having means for producing a current at an output coupled to the control terminal of said switching control means, and said frequency control means including a control input port for electrically connecting an external resistor to said first current source, and said frequency control means includes a voltage control line coupled to one of said first and second current sources and means responsive to a voltage signal applied to said voltage control line for controlling the operation of said respective first and second current sources.

9. The oscillator claimed in claim 8, wherein said frequency control means includes a voltage reference source, and said first current source comprises a first transistor and said second current source comprises a second transistor, each of said transistors having a base input, an emitter output and a collector output, said voltage reference source being connected to the base input of said second transistor, and the emitter output of said second transistor being coupled to the base input of said first transistor through a diode-connected transistor, the emitter output of said first transistor being connected to said control input port through a resistor, and the emitter output of said first transistor also providing said external port for said external resistor, and the collector output of said first transistor forming the output for said first current source and being coupled to the first terminal of said switching means and the collector output of said second transistor forming the output for said second current source and being connected to the second terminal of said switching control means.

10. The oscillator claimed in claim 9, wherein said first current source is coupled to said switching means through a pair of accelerator transistors, each of said accelerator transistors having a base input, an emitter output and a collector output, the emitter outputs of said accelerator transistors being coupled together and connected to the collector output of said first transistor, the collector output of said first accelerator transistor being connected to the emitter output of said first transistor in said switching means, and the collector output of said second accelerator transistor being connected to the emitter output of said second transistor in said switching means, and the base inputs of said accelerator transistors being coupled to said output port.

* * * * *